(12) United States Patent
McLellan

(10) Patent No.: US 12,238,872 B2
(45) Date of Patent: Feb. 25, 2025

(54) CIRCUIT BOARD WITH BRIDGE CHIPLETS

(71) Applicant: ADVANCED MICRO DEVICES, INC., Santa Clara, CA (US)

(72) Inventor: Robert N. McLellan, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/667,467

(22) Filed: Feb. 8, 2022

(65) Prior Publication Data

US 2022/0167506 A1    May 26, 2022

Related U.S. Application Data

(62) Division of application No. 15/287,255, filed on Oct. 6, 2016, now Pat. No. 11,277,922.

(51) Int. Cl.
*H05K 3/36* (2006.01)
*H01L 21/48* (2006.01)
(Continued)

(52) U.S. Cl.
CPC ......... *H05K 3/368* (2013.01); *H01L 21/4807* (2013.01); *H01L 21/485* (2013.01); *H01L 21/52* (2013.01); *H01L 23/5383* (2013.01); *H01L 25/0652* (2013.01); *H01L 25/0655* (2013.01); *H05K 1/142* (2013.01); *H05K 1/186* (2013.01); *H01L 23/5385* (2013.01); *H01L 24/13* (2013.01); *H01L 24/16* (2013.01); *H01L 24/29* (2013.01); *H01L 24/32* (2013.01); *H01L 24/73* (2013.01); *H01L 24/81* (2013.01); *H01L 2224/13101* (2013.01); *H01L 2224/13144* (2013.01); *H01L 2224/16225* (2013.01); *H01L 2224/2919* (2013.01); *H01L 2224/2929* (2013.01); *H01L 2224/29386* (2013.01); *H01L 2224/32225* (2013.01); *H01L 2224/73204* (2013.01); *H01L 2224/81815* (2013.01); *H01L 2224/83192* (2013.01); *H01L 2224/92125* (2013.01); *H01L 2924/15192* (2013.01); *H01L 2924/15311* (2013.01); *H05K 1/0306* (2013.01);
(Continued)

(58) Field of Classification Search
CPC ..................... H01L 2224/24135–24147; H01L 25/0655–0657; H01L 23/5383; H01L 23/49822
See application file for complete search history.

(56) References Cited

U.S. PATENT DOCUMENTS 5,615,087 A    3/1997  Wieloch
8,298,945 B2  10/2012  Leung et al.
(Continued)

OTHER PUBLICATIONS

USPTO Office Action Mailed Jan. 29, 2014, U.S. Appl. No. 13/665,706, filed Oct. 31, 2012.
(Continued)

*Primary Examiner* — Amar Movva

(57) ABSTRACT

Various circuit boards and methods of fabricating and using the same are disclosed. In one aspect, a circuit board is provided that has a substrate with a pocket and a conductor layer. A chiplet is positioned in the pocket. The chiplet has plural bottom side interconnects electrically connected to the conductor layer and plural top side interconnects adapted to interconnect with two or more semiconductor chips.

19 Claims, 8 Drawing Sheets

(51) Int. Cl.
  *H01L 21/52* (2006.01)
  *H01L 23/00* (2006.01)
  *H01L 23/538* (2006.01)
  *H01L 25/065* (2023.01)
  *H05K 1/03* (2006.01)
  *H05K 1/14* (2006.01)
  *H05K 1/18* (2006.01)

(52) U.S. Cl.
  CPC ........... *H05K 1/0313* (2013.01); *H05K 1/181* (2013.01); *H05K 2201/0187* (2013.01); *H05K 2201/10378* (2013.01)

(56) References Cited

U.S. PATENT DOCUMENTS

| | | | |
|---|---|---|---|
| 8,558,395 B2* | 10/2013 | Khan | H01L 23/49833 |
| | | | 257/E23.174 |
| 8,946,900 B2 | 2/2015 | Qian et al. | |
| 9,171,816 B2* | 10/2015 | Teh | H01L 24/25 |
| 9,240,377 B2 | 1/2016 | Qian et al. | |
| 9,368,450 B1* | 6/2016 | Gu | H01L 23/5385 |
| 2002/0172026 A1 | 11/2002 | Chong et al. | |
| 2003/0016133 A1 | 1/2003 | Egbert | |
| 2009/0135574 A1 | 5/2009 | Tanaka et al. | |
| 2011/0010932 A1 | 1/2011 | Tanaka et al. | |
| 2012/0007211 A1 | 1/2012 | Aleksov et al. | |
| 2012/0286419 A1 | 11/2012 | Kwon et al. | |
| 2013/0049127 A1 | 2/2013 | Chen et al. | |
| 2013/0168854 A1 | 7/2013 | Karikalan et al. | |
| 2013/0256000 A1 | 10/2013 | Terui et al. | |
| 2014/0102768 A1 | 4/2014 | Shizuno et al. | |
| 2014/0264791 A1 | 9/2014 | Manusharow et al. | |
| 2014/0332966 A1 | 11/2014 | Xiu et al. | |
| 2015/0001717 A1 | 1/2015 | Karhade et al. | |
| 2015/0001733 A1 | 1/2015 | Karhade et al. | |
| 2015/0048515 A1 | 2/2015 | Zhang et al. | |
| 2015/0092378 A1 | 4/2015 | Roy et al. | |
| 2015/0228583 A1 | 8/2015 | Karhade et al. | |
| 2015/0340353 A1 | 11/2015 | Starkston et al. | |
| 2015/0340459 A1 | 11/2015 | Lee | |
| 2016/0085899 A1 | 3/2016 | Qian et al. | |
| 2016/0181189 A1 | 6/2016 | Qian et al. | |
| 2016/0247763 A1* | 8/2016 | Chiu | H05K 3/4694 |

OTHER PUBLICATIONS

Wang et al., Coreless Substrate for High Performance Flip Chip Packaging, 2010 11th International Conference on Electronic Packaging Technology & High Density Packaging, IEEE Xplore, Date Added to IEEE Xplore: Sep. 23, 2010, Downloaded on May 18, 2021, 5 pages.

* cited by examiner

CIRCUIT BOARD WITH BRIDGE CHIPLETS

BACKGROUND OF THE INVENTION

1. Field of the Invention

This invention relates generally to semiconductor processing, and more particularly to circuit boards with chip-to-chip interconnects and methods of making the same.

2. Description of the Related Art

A conventional type of multi-chip module includes two semiconductor chips mounted side-by-side on a carrier substrate or in some cases on an interposer that is, in-turn, mounted on a carrier substrate. The semiconductor chips are flip-chip mounted to the carrier substrate and interconnected thereto by respective pluralities of solder joints. The carrier substrate is provided with plural electrical pathways to provide input/output pathways for the semiconductor chips both for inter-chip power, ground and signal propagation as well as input/output from the interposer itself. The semiconductor chips include respective underfill material layers to lessen the effects of differential thermal expansion due to differences in the coefficients of thermal expansion of the chips, the interposer and the solder joints.

Chip geometries have continually fallen over the past few years. However the shrinkage in chip sizes has been accompanied by an attendant increase in the number of input/outputs for a given chip. This has led to a need to greatly increase the number of chip-to-chip interconnects for multi-chip modules. One conventional technique to address the need for increased chip-to-chip interconnects involves using a high density design rule across all regions of a package substrate. This can be a costly solution due to manufacturing complexity and yield issues. Another conventional solution uses 3D stacking of chips and through-silicon-vias for interconnections. This too is complex and costly.

Some conventional designs use embedded interconnect bridges (EMIB). These are typically silicon bridge chips (but occasionally organic chiplets with top side only input/outputs) that are embedded in the upper reaches of the package substrate. Conventional EMIBs are typically dropped in and held in place by an adhesive. The silicon is costly and alignment of the EMIB is logistically complex. Furthermore, conventional EMIBs do not provide through-board connectivity, and thus impose a routing penalty in the location of the EMIB.

The present invention is directed to overcoming or reducing the effects of one or more of the foregoing disadvantages.

SUMMARY OF THE INVENTION

In accordance with one aspect of the present invention, a circuit board is provided that has a substrate with a pocket and a conductor layer. A chiplet is positioned in the pocket. The chiplet has plural bottom side interconnects electrically connected to the conductor layer and plural top side interconnects adapted to interconnect with two or more semiconductor chips.

In accordance with another aspect of the present invention, a method of manufacturing a circuit board is provided. The method includes providing a substrate that has a conductor layer and fabricating a pocket in the circuit board. A chiplet is positioned in the pocket. The chiplet has plural bottom side interconnects and plural top side interconnects. The top side interconnects are adapted to interconnect with two or more semiconductor chips. The bottom side interconnects are electrically connected to the conductor layer.

In accordance with another aspect of the present invention, a method of manufacturing is provided that includes fabricating a chiplet to insert into a pocket of a circuit board. The chiplet has plural bottom side interconnects to electrically connect to a conductor layer of the circuit board and plural top side interconnects adapted to interconnect with two or more semiconductor chips.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Circuit boards, such as package substrates, with one or more bridge chiplets for chip-to-chip interconnections are disclosed. An exemplary circuit board may be fabricated with a pocket to receive a chiplet. The chiplet includes plural top side interconnects and plural bottom side interconnects to provide both chip-to-chip interconnections and through board pathways. Organic, ceramic or even semiconductor materials may be used for the chiplets. Additional details will now be disclosed.

Figure 1:
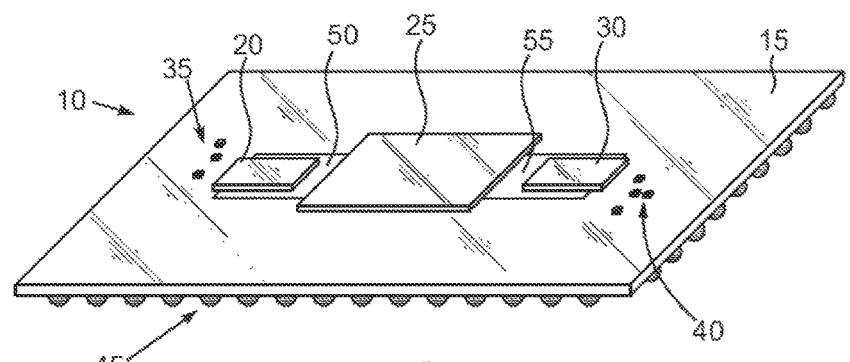
FIG. 1 is a pictorial view of an exemplary embodiment of a semiconductor chip device that includes a circuit board and one or more semiconductor chips.
Figure 2:
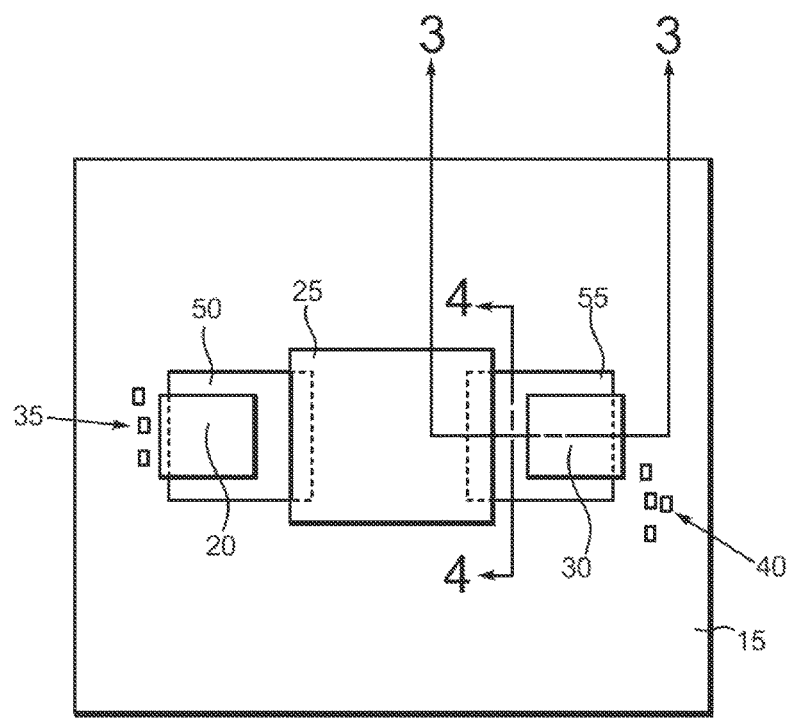
FIG. 2 is a plan view of the semiconductor chip device depicted in FIG. 1.

In the drawings described below, reference numerals are generally repeated where identical elements appear in more than one figure. Turning now to the drawings, and in particular to FIGS. 1 and 2, therein is depicted an exemplary embodiment of a semiconductor chip device (or a system) 10 that may include a circuit board 15 and multiple semiconductor chips 20, 25 and 30 mounted on the circuit board 15. In this illustrative embodiment, there are three semiconductor chips 20, 25 and 30 positioned on the circuit board 15. However, the number and spatial arrangement of the semiconductor chips 20, 25 and 30 may take on a great variety of configurations. Similarly, the circuit board 15 may be populated with plural surface components, groups of which are collectively labeled 35 and 40, respectively. The surface components 35 and 40 may be capacitors, inductors, resistors, or other types of components, and may number more or less than what is shown. The circuit board 15 may be a package substrate, a system board, or other type of circuit board as desired. To interface electrically with some other electronic components, such as a computing device or other electronic device (not shown), the circuit board 50 may be provided with plural input/outputs, which in this illustrative embodiment are depicted as a solder ball grid array 45. However, other types of interconnect structures, such as pins, lands or other type of interconnect structures may be used as well.

The semiconductor chips 20, 25 and 30 may be any of a myriad of different types of circuit devices used in electronics, such as, for example, microprocessors, graphics processors, combined microprocessor/graphics processors, application specific integrated circuits, memory devices, active optical devices, such as lasers, passive optical devices or the like, interposers, and may be single or multi-core or even stacked laterally with additional dice.

As described in more detail below, the circuit board 15 may include one or more embedded chiplets 50 and 55 to provide chip-to-chip interconnects and also electrical pathways through the circuit board 15. The circuit structures of the chiplets 50 and 55 may be constructed using one more design rules for higher density circuit structures while the circuit structures of the remainder of the circuit board 15 may be constructed using one or more design rules for lower density circuit structures. The high density design rules are used to create in the chiplets 50 and 55 larger numbers of electrical pathways than would ordinarily be possible using a lower density design rule for the remainder of the circuit board 15. The chiplets 50 and 55 may be used for a variety of purposes. For example, the chiplet 50 may be used to provide large numbers of electrical pathways between the semiconductor chip 20 and 25 as well as electrical pathways to and from the semiconductor chips 20 and 25, through the circuit board 15 and out to the I/O's 45 if desired. The chiplet 55 may be used to provide large numbers of electrical pathways between the semiconductor chip 25 and the semiconductor chip 30 as well as electrical pathways to and from the semiconductor chips 25 and 30 through the circuit board 15 and out to the I/O's 45 if desired. It should be understood that the chiplets 50 and 55 may number other than two, be of various footprints and be spatially arranged in a huge variety of ways on the circuit board 15 depending upon the electronic requirements of the circuit board 15, the number of semiconductor chips mounted thereon and other design considerations.

Figure 3:
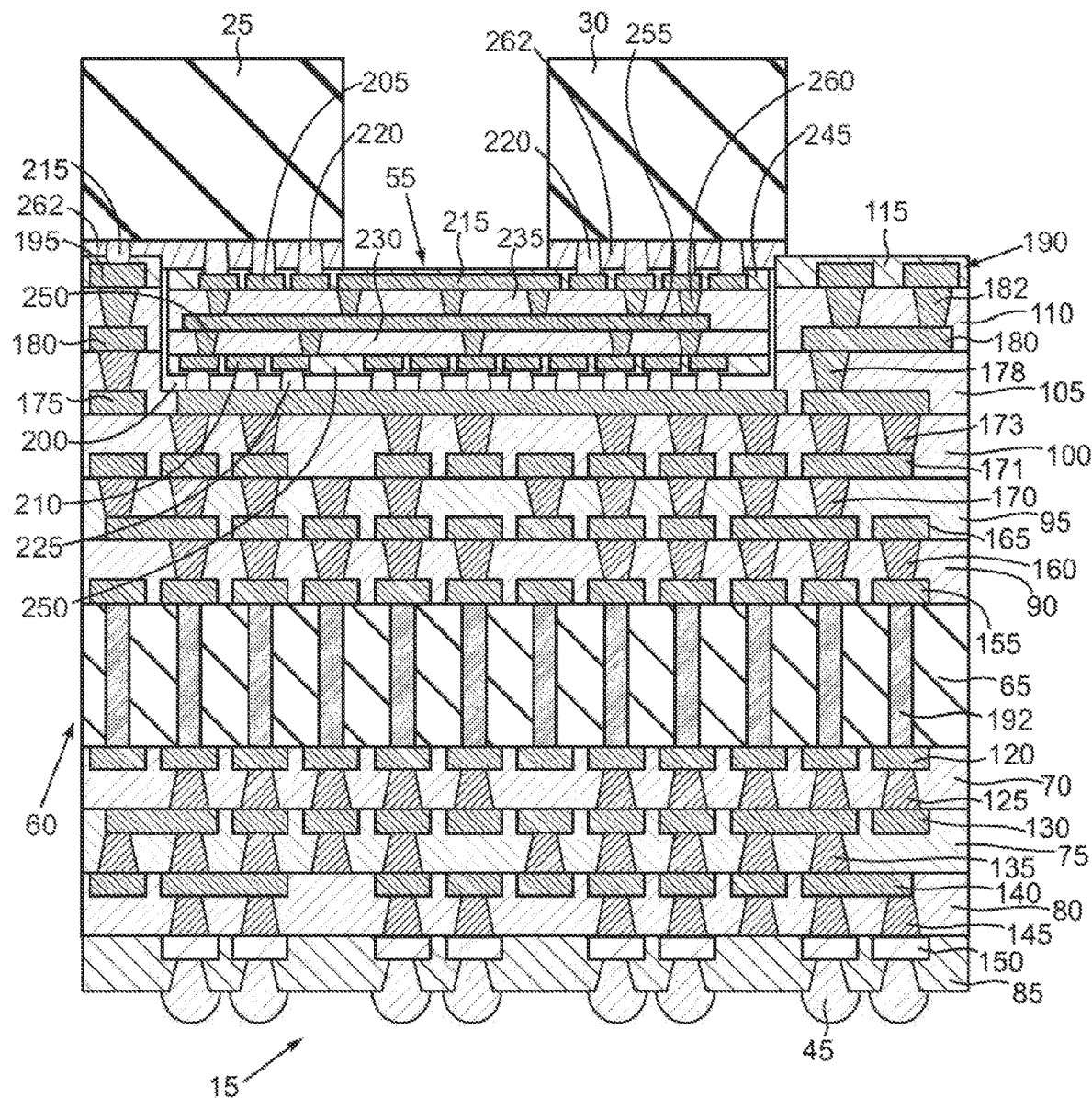
FIG. 3 is a sectional view of FIG. 2 taken at section 3-3.
Figure 4:
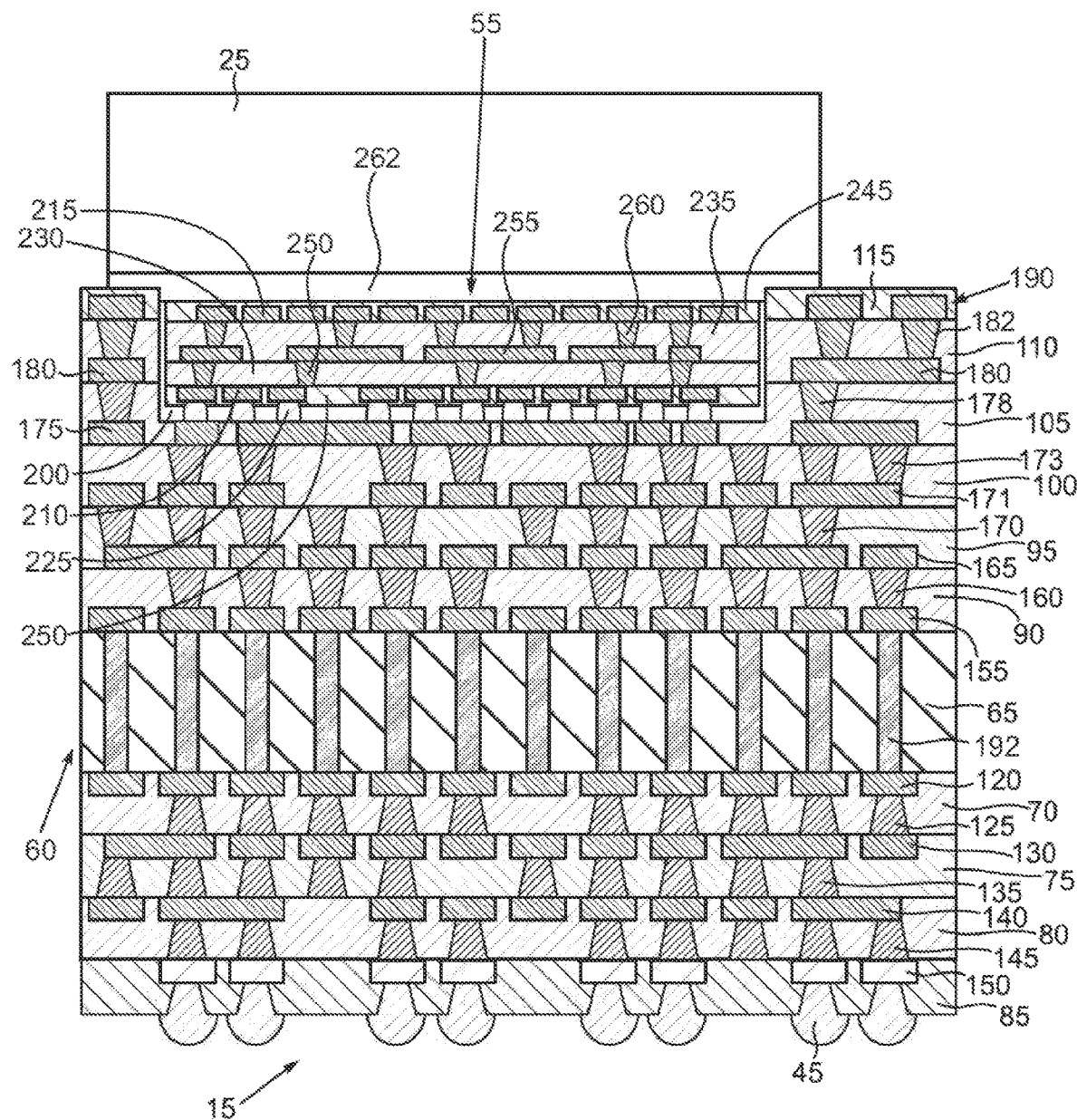
FIG. 4 is a sectional view of FIG. 2 taken at section 4-4.

Additional details of the circuit board 15 may be understood by referring now also to FIG. 3, which is a sectional view of FIG. 2 taken at section 3-3 and to FIG. 4, which is a sectional view of FIG. 2 taken at section 4-4. It should be noted that section 3-3 extends through a portion of the circuit board 15 and includes part of the semiconductor chip 25, the semiconductor chip 30 and the chiplet 55. It should be noted that section 4-4 extends through a portion of the circuit board 15 that includes the chiplet 55, but the semiconductor chip 30 is not visible and the semiconductor chip 25, while visible, is not shown in section. The circuit board 15 may be a package substrate or other type of printed circuit board as described elsewhere herein. Monolithic or build-up structures may be used that make up a substrate. If a build-up design is used, the circuit board 15 may include a substrate 60 that consists of a central core 65 upon which one or more build-up layers are formed and below which an additional one or more build-up layers are formed. The core 65 itself may consist of a stack of one or more layers. The number of layers in the circuit board 15 can vary from four to sixteen or more, although less than four may be used. So-called "coreless" designs may be used as well. The layers of the circuit board 15 consist of an insulating material, such as various well-known epoxies or other resins, interspersed with metal interconnects. A multi-layer configuration other than build-up could be used. Optionally, the circuit board 15 may be composed of well-known ceramics or other materials suitable for package substrates or other printed circuit boards.

In this illustrative embodiment, the circuit board 15 may be a build-up design that includes the core 65, three lower build-up layers 70, 75 and 80 and a bottom solder resist layer 85 and five upper build-up layers 90, 95, 100, 105 and 110 and a top solder resist layer 115. As note above, the number of build-up layers 70, 75, 80, 90, 95, 100, 105 and 110 may be varied and symmetric, that is, of the same number on either side of the core 65 (or even if coreless) or asymmetric as depicted. The core 65 may be monolithic or a laminate of two or more layers as desired. The core 65 may be constructed of one or more layers of glass filled epoxy or other polymeric materials. The build-up layers 70, 75, 80, 90, 95, 100, 105 and 110 may be composed of well-known polymeric materials, such as, GX13 supplied by Ajinomoto, Ltd. or other types of polymers. The solder resist layers 85 and 115 may be fabricated from a variety of materials suitable for solder mask fabrication, such as, for example, PSR-4000 AUS703 manufactured by Taiyo Ink Mfg. Co., Ltd. or SR7000 manufactured by Hitachi Chemical Co., Ltd. The build-up layer 70 may include a conductor layer 120 that includes plural conductor structures, such as lines, via lands, pads, etc. In addition, the build-up layer 70 includes plural conductive vias 125 that are formed on the structures of the conductor layer 120. The conductor layer 120 and the conductive vias 125 may be composed of copper, aluminum, gold, silver, palladium, platinum or other conductors or combinations of these. The same is true for the conductor layers and vias in the other build-up layers 75, 80, 90, 95, 100, 105 and 110. The build-up layer 75 similarly includes a conductor layer 130 and plural conductive vias 135 and the build-up layer 80 also includes a conductor layer 140 and plural conductive vias 145. Embedded within the solder resist layer 85 is a bottommost conductor layer 150, which may consist of plural ball pads or other conductor structures depending upon the type of I/O structures used and thus in this case the solder balls 45. The conductor layer 150 may be composed of copper, aluminum, gold, silver, palladium, platinum or other conductors. If solder contamination is a technical concern then the conductor layer 150, and any other disclosed conductor structure destined for solder connection, may be constructed with barrier materials, such as nickel or nickel-vanadium or others. Any of the conductor structures disclosed herein as possibly being composed of solder may be composed of various types of solders, such as lead-free or lead-based solders. Examples of suitable lead-free solders include tin-silver (about 97.3% Sn 2.7% Ag), tin-copper (about 99% Sn 1% Cu), tin-silver-copper (about 96.5% Sn 3% Ag 0.5% Cu) or the like. Examples of lead-based solders include tin-lead solders at or near eutectic proportions or the like.

Turning to the opposite side of the core 65, the build-up layer 90 may include a conductor layer 155 composed of plural conductor structures of the type described above as well as plural conductive vias 160, again of the type described above, in conjunction with the lower build-up layers 70, 75 etc. The build-up layer 95 similarly may include a conductor layer 165 and plural conductive vias 170, the build-up layer 100 may similarly include a conductor layer 171 and conductive vias 173, the build-up layer 105 may similarly include a conductor layer 175 and conductive vias 178, the build-up layer 110 may similarly include a conductor layer 180 and conductive vias 182, and the solder resist layer 115 may include a conductor layer 190 that includes 110 pads 195 and other traces or conductors. The electrical pathways between the upper build-up layers 90, 95 etc. and the lower build-up layers 70, 75 etc. may be provided through the core 65 by way of plural through vias 192, which may be composed of same types of materials disclosed elsewhere herein in conjunction with conductor layers and vias.

The chiplet 55 will now be described in conjunction with FIGS. 3 and 4. The following description of the chiplet 55 will be illustrative of the chiplet 50 as well. The chiplet 55 is positioned in a pocket 200 in the circuit board 15. The pocket 200 may extend into the circuit board 15 to some depth and thus penetrate through the solder resist layer 115, and one or more of the build-up layers, and in this illustrative embodiment the build-up layers 110 and 105. The fabrication of the pocket 200 will be described in conjunction with subsequent figures. The chiplet 55 has plural top side interconnects 205 that are designed to provide electrical connectivity with the semiconductor chips 25 and 30, respectively, and plural bottom side interconnects 210 that are designed to provide electrical connectivity to various conductor structures of the circuit board 15. Depending upon the depth of the pocket 200, the bottom interconnects 210 may interface electrically with a particular conductor layer, such as, in this illustrative embodiment, the conductor layer 175 of the build-up layer 105. In this way, the chiplet 55 provides not only chip-to-chip interconnects between the semiconductor chips 25 and 30 but also electrical pathways from the chips 25 and 30 through the circuit board 15 to the I/Os 45 and vice versa. This is in contrast to conventional EMIB devices, which do not include bottom interconnects and thus through-board interconnectivity. The upper most conductor layer of the chiplet 55 may include the aforementioned top side interconnects 205 and in addition plural conductor traces, one of which is visible in FIG. 3 and labeled 215 and plural of which are visible in FIG. 4. These plural traces 215 and other conductors of the chiplet 55 provide multiple electrical pathways between the semiconductor chips 25 and 30. The chiplet 55 may interface electrically with the semiconductor chips 25 and 30 by way of plural interconnect structures 220, which may be solder bumps, micro bumps of solder, gold, or other materials, conductive pillars with or without solder caps or other interconnect structures as desired. The chiplet 55 may electrically interconnect with the circuit board 15, and in this illustrative embodiment by way of the conductor layer 175, by way of plural interconnect structures 225, which may be configured like the interconnect structures 220 just described. If solder structures are used for or in conjunction with the bottom interconnect structures 225, then a solder reflow to establish connections with the conductor layer 175 will provide an advantageous spatial alignment feature to very accurately align the chiplet 55 at the time of insertion into the pocket 200 due to surface tension effects as described in more detail below. Note that the upper surfaces of the top side interconnects 205 are at a slightly different elevation than the upper surfaces of the I/O pads 195. However, this elevation difference may be kept quite small and perhaps at or near zero.

The chiplet 55 may take on a variety of configurations and be constructed of a variety of materials. Examples include build-up designs not unlike the build-up nature of the circuit board 15 itself. Other examples include monolithic structures, such as monolithic organic structures, monolithic ceramic structures or other types of circuit board configurations that involve perhaps prepreg sheets or other types of laminations of insulating materials. In this illustrative embodiment, the chiplet 55 may be configured as a build-up design that includes build-up layers 230 and 235, a top solder resist layer 245 and a bottom solder resist layer 250. The build-up layer 230 may include conductive vias 250 and/or other conductor structures, and the build-up layer 235 may include conductor traces 255 and conductive vias 260. If constructed of an organic build-up design like the circuit board 15, the build-up layers 230 and 235 including the conductor structures thereof may be fabricated using the techniques described elsewhere herein for the build-up layers of the circuit board 15, albeit using perhaps smaller design rules that are suitable for more densely packed circuit structures of the chiplet 55. The various conductor structures of the chiplet 55, e.g., the top side interconnects 205, the bottom side interconnects 210, vias 250 and the conductor traces 255, may be constructed of the same types of materials disclosed above for the build-up layers 75, 80, 90, 95, 100, 105 and 110 of the circuit board 15.

Well-known chip mounting processes may be used to mount the semiconductor chips 25 and 30 to the circuit board 15, such as flip-chip and solder reflow. Underfills 262 may be positioned between the semiconductor chips 25 and 30 and the circuit board 15 to lessen the effects of stresses induced by differences in coefficients of thermal expansion of the chips 25 and 30 and the circuit board 15. The underfills 262 may be composed of well-known epoxy materials, such as epoxy resin with or without silica fillers and phenol resins or the like. Two examples are types 8437-2 and 2BD available from Namics. The underfills 262 may be deposited before or after chip mounting. If desired, an underfill (not visible) may be placed in the unoccupied spaces of the pocket 200 to serve the same thermal expansion management function.

Figure 5:
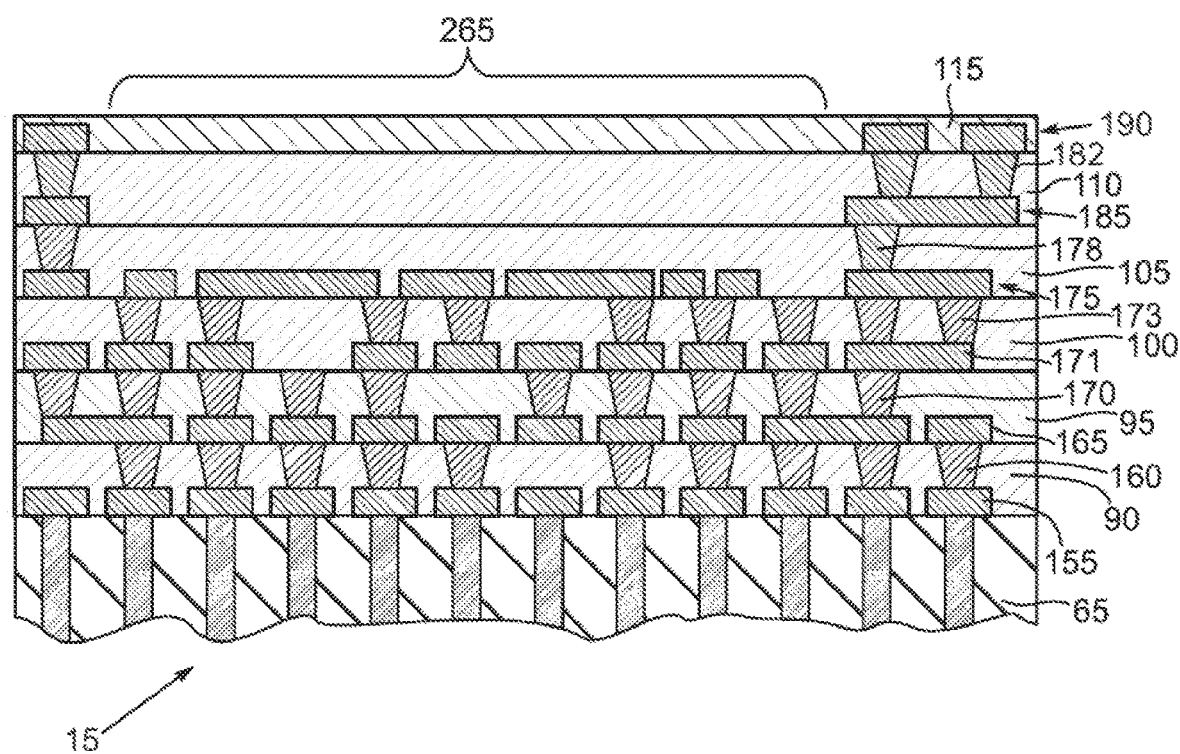
FIG. 5 is a sectional view depicting initial exemplary build-up layer fabrication of an exemplary circuit board.

An exemplary method of fabricating the circuit board 15 may be understood by referring now to FIGS. 5, 6, 7 and 8 and initially to FIG. 5, which is a sectional view like FIG. 4 but depicting the circuit board 15 following the fabrication of the build-up layers 90, 95, 100, 105, 110 and the solder resist layer 115 but prior to the fabrication of the pocket 200 depicted in FIGS. 3 and 4. For simplicity of illustration, the portion of the circuit board 15 below the core 65 is shown cut away. It should be understood that the fabrication process for the circuit board 15 disclosed herein could be performed on a discrete board basis or en masse followed by singulation. The conductor layer 155 may be initially fabricated by applying a layer of conductor material using well-known techniques and thereafter appropriate masking and material removal, such as by etching, to establish the individual conductor structures of the conductor layer 155. A directional plasma etch using agents suitable for the materials) of the conductor layer 155 may be used. Endpoint should be monitored to avoid excessive attack of the conductor structures in the underlying core 65. Following the etch process, the mask (not shown) may be removed by asking, solvent stripping or combinations of the two. The mask strip should be tailored to avoid unacceptable damage to the core 65. Lift-off techniques could also be used. Thereafter, the build-up layer 90 may be applied over the conductor layer 155 by well-known techniques and then the via holes necessary to establish the conductive vias 160 may be formed using laser drilling, chemical etching, or by photolithography wherein the build-up layer 90 is provided with photoactive compounds that enable openings to be formed using well-known photolithographic techniques. The conductive vias 160 may be formed by way of well-known plating or other deposition techniques. The same processes are applied to the build-up layers 95, 100, 105 and 110 and the solder resist layer 115 to establish the conductor layers 165, 171, 175, 185 and 190, and the vias 170, 173, 178 and 182. Indeed the same techniques may be used to fabricate the other build-up layers 70, 75 and 80 and the solder resist layer 85 depicted in FIGS. 3 and 4. Like the solder resist layer 85 shown in FIGS. 3 and 4, the solder resist layer 115 may be applied using well-known techniques and will typically include photoactive compounds to enable the straightforward photolithographic patterning thereof to establish openings to the conductor layer 190 for the various solder interconnect structures 215 and 220 shown in FIGS. 3 and 4.

In this illustrative embodiment, the build-up layers 75, 80, 90, 95, 100, 105 and 110 and the solder resist layers 85 and 110 may be patterned using a given design rule with given nominal geometries for lines and spaces. However, the circuit structures of the chiplet 55 may be constructed using a design rule or rules that have a smaller nominal geometry for lines and spaces and thus a higher density. The nomenclature for a typical design rule is x µm/x µm (e.g., 10 µm/10 µm) where the numerator indicates the minimum width for a conductor line and the denominator indicates the minimum width for a space between adjacent conductor lines or other conductor structures. Here the units are microns, but the principle applies equally for other units. A x µm/x µm (lines and spaces) is a typical design rule definition, but some other definition could be used to still achieve a technical goal of patterning the chiplet 55 with a higher circuit density than the circuit board 15.

Figure 6:
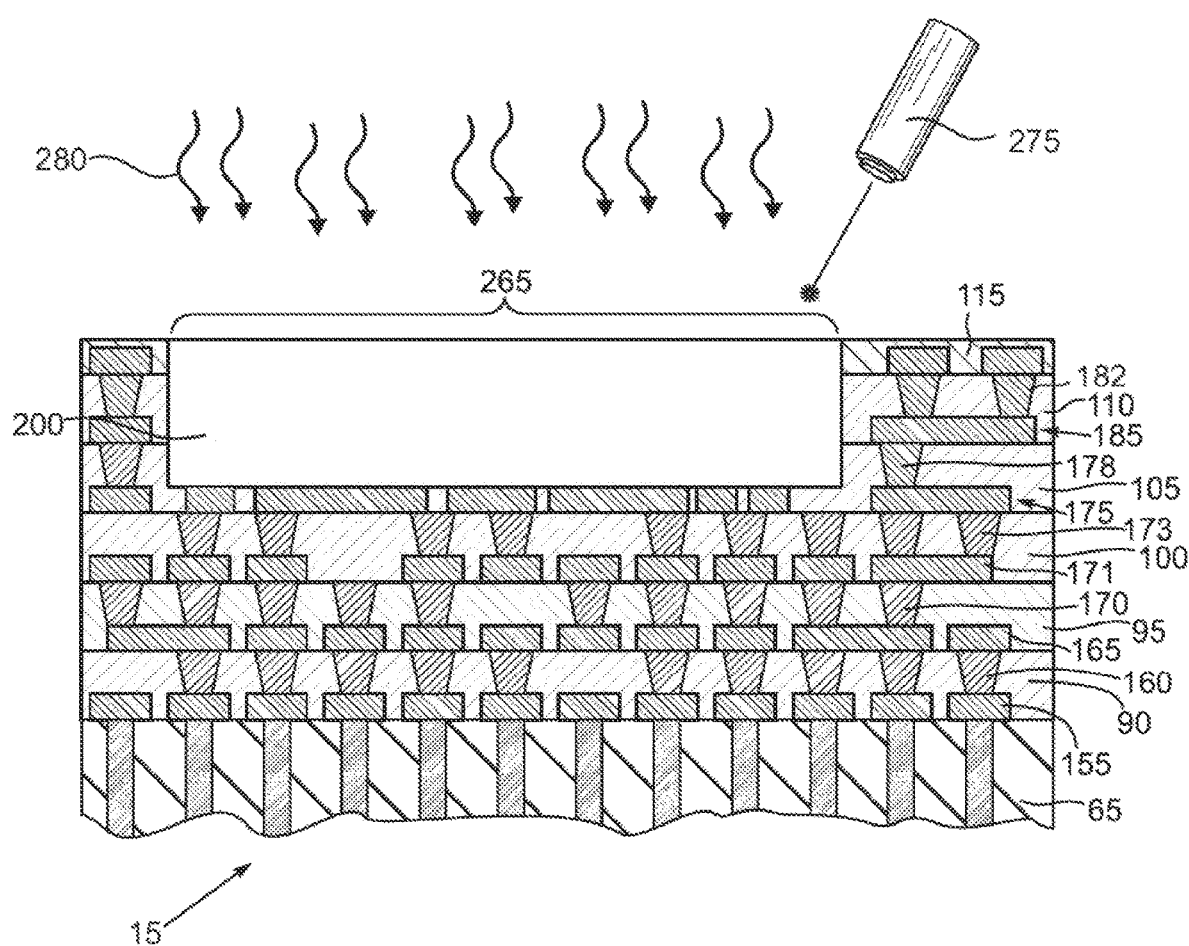
FIG. 6 is a sectional view like FIG. 5, but depicting exemplary chiplet pocket fabrication.

As is evident from FIG. 5, the processing at this point is designed to leave a conductor void in a target zone 265 of the circuit board 15 where the pocket 200 shown in FIGS. 3 and 4 will eventually be fabricated. Thus, the build-up layer 110 may be constructed with few or no conductor structures within the target zone 265 and the same is true for the solder resist layer 115. But because, in this illustrative embodiment, the chiplet 55 will eventually electrically interface with the conductor layer 175, the conductor layer 175 will include extensive amounts of conductor structures in the target zone 265. Next and as shown in FIG. 6, the pocket 200 may be formed in the target zone 265 of the circuit board 15 to expose a portion of the conductor layer 175. The construction of the pocket 200 may be conducted in a variety of ways. For example, the pocket 200 may be cut with a laser source 275 or by way of photolithography masking and exposure radiation 280 and subsequent development or combinations of these as desired. If photolithography is used, it may be possible to infuse the layers to be patterned, such as the build-up layers 105 and 110 and the solder resist layer 115, with photoactive compounds and thereafter perform a masked exposure and development process in order to create the pocket 200. This may entail suitable masking of the portions of the solder resist layer 115 external to the target zone 265 where the pocket 200 is to be created. Alternatively, and where the build-up layers 105 and 110 are constructed from sheets, a hole with the outline of the pocket 200 may be cut in each of the sheets prior to application to the circuit board 15. The solder resist layer 115 may then be patterned by laser or photolithography to complete the pocket 200.

Figure 7:
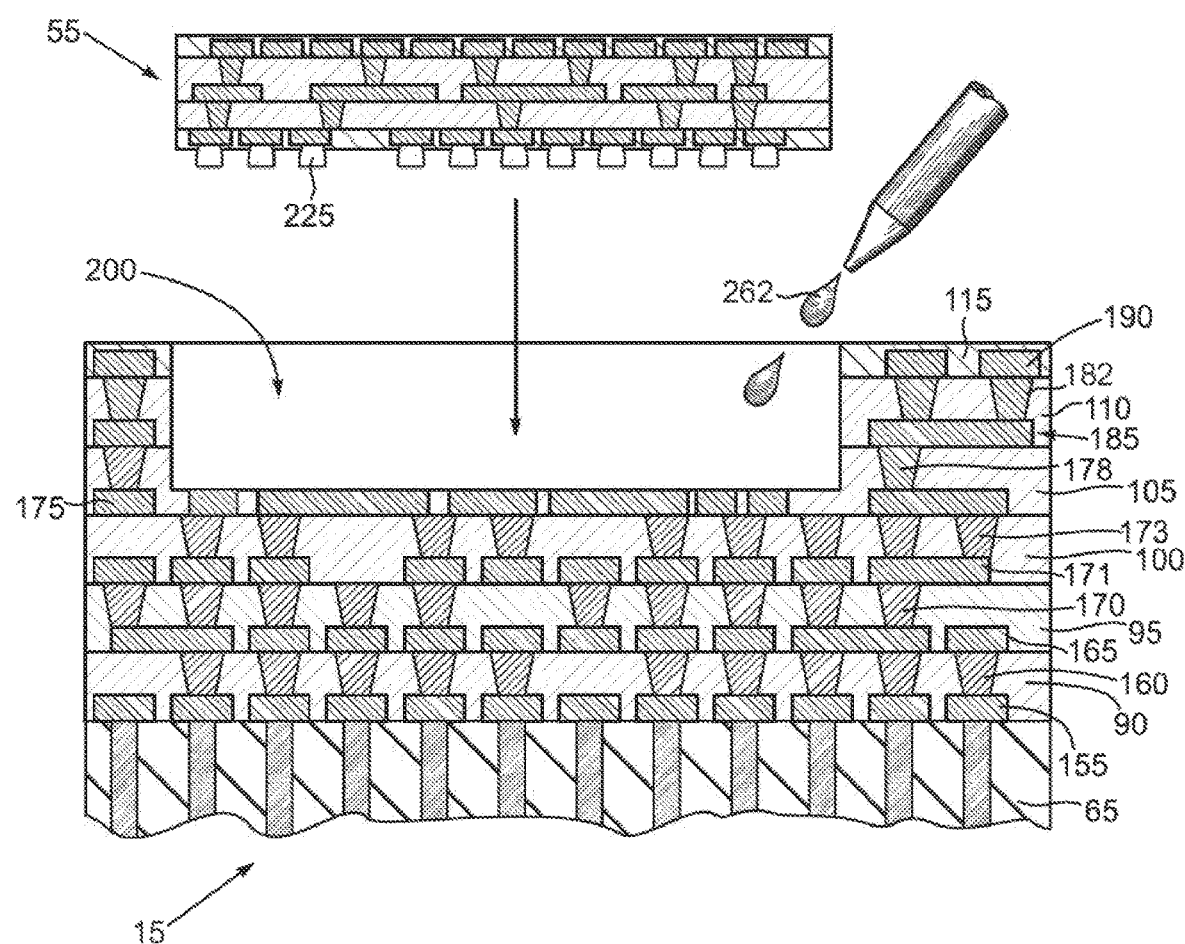
FIG. 7 is a sectional view like FIG. 6, but depicting exemplary chiplet mounting.

Next and as depicted in FIG. 7, the chiplet 55 may be positioned in the pocket 200 of the circuit board 15 and positioned so that the lower interconnects 225 are seated on or in very close proximity to the conductor structures of the conductor layer 175 in the pocket 200 and thereafter a suitable reflow may be performed in order to establish metallurgical connections between the interconnects 225 and the conductor structures of the layers 175. It may also be possible to position the bottom interconnects 225 on the conductor layer 175 first and thereafter position the chiplet 55. The chiplet 55 may, but need not, be positioned completely in the pocket 200. An underfill 262 of the type disclosed elsewhere herein may be applied in the pocket 200 before or after placement of the chiplet 55. The underfill 262 may fill part of the pocket 200 not otherwise occupied by the chiplet 55 or may even be used to encapsulate the chiplet. However, encapsulation will need to accommodate the ultimate metallurgical connections with the chips 25 and 30.

Figure 8:
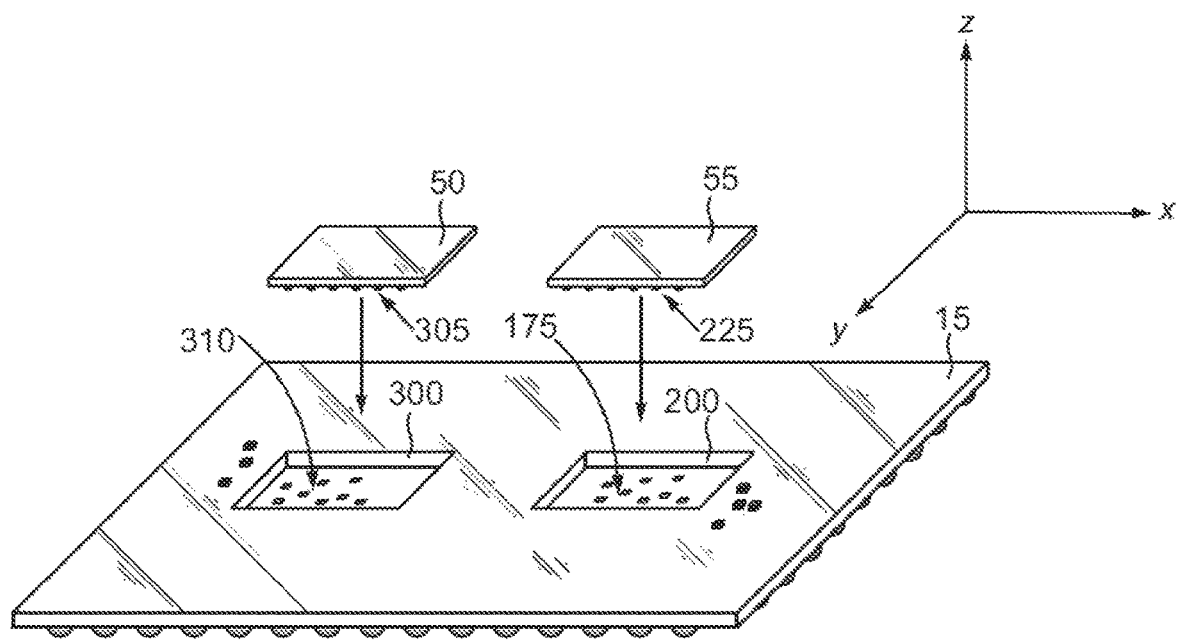
FIG. 8 is pictorial view depicting alternate exemplary chiplet mounting.

As depicted in FIG. 8, the utilization of the bottom interconnects 225 in conjunction with the conductor structures of the conductor layer 175 provides a benefit beyond intra and/or through-board interconnections. Indeed, the bottom interconnects 225, by way of surface tension effects, can aid in the spatial positioning of the chiplet 55. This can be understood by referring now also to FIG. 8, which is a pictorial view of the circuit board 15 with the chiplet 55 shown exploded from the pocket 200 and the chiplet 50 also shown exploded from a corresponding pocket 300 of the circuit board 15. When the lower interconnects 225 of the chiplet 55 are seated on the conductor structures of the conductor layer 175 and a reflow is performed, surface tension effects will accurately position the chiplet 55 in the x-y plane during reflow. This provides a solution to the problem of spatial alignment in the x-y plane of the chiplet 55. The same process applies by way of the metallurgical bonding between lower interconnects 305 of the chiplet 50 and conductor structures of a conductor layer 310 of the circuit board, which may be conductor structures of the same conductor layer 175 or, alternatively, of a different conductor layer of the circuit board 15. For example, the pockets 200 and 300 may have the same depth and thus exposure to the same conductor layer of the circuit board 15 or different depths as desired. In any event, the same advantageous accurate spatial alignment in the x-y plane for the chiplet 50 may be realized.

Figure 9:
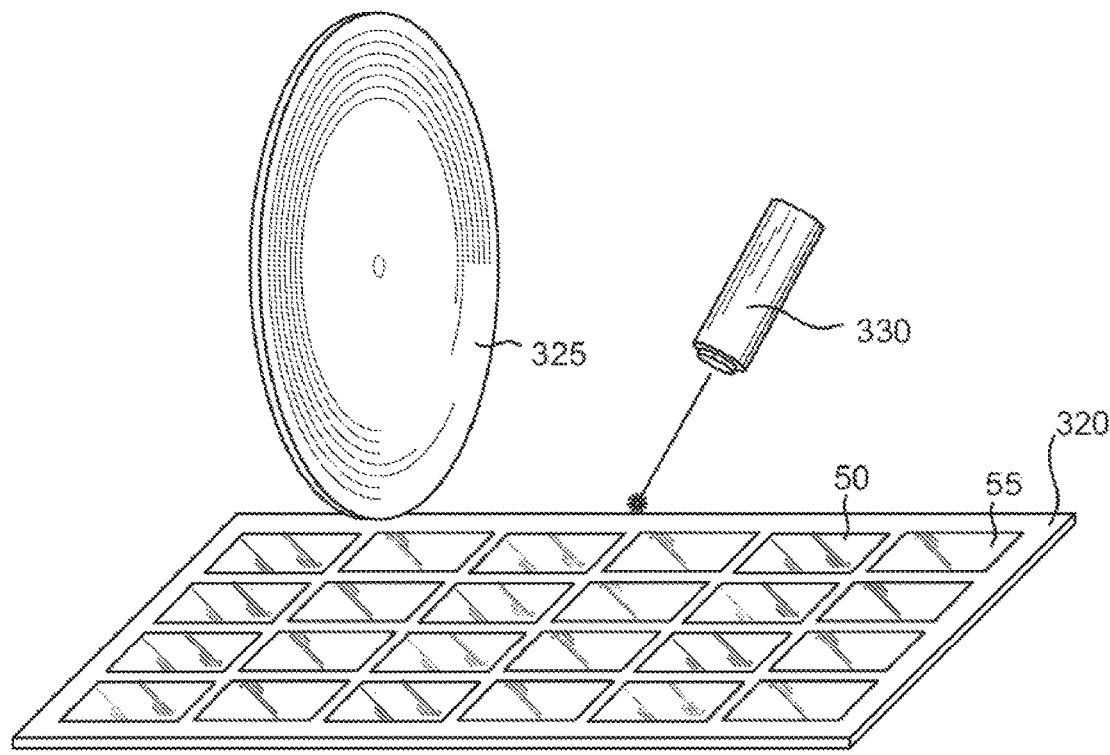
FIG. 9 is a pictorial view of depicting exemplary chiplet production and singulation.

As noted above, the chiplet 55 may be fabricated using a variety of different processes depending upon its composition. It should be understood that the chiplet 55 may be fabricated as a discrete device or en masse as depicted in FIG. 9. Here, the chiplets 50 and 55 may be fabricated along with plural copies of the chiplet 55 as part of a larger strip 320. The chiplet 55 and others like it may then be subsequently singulated by way of mechanical saw 325 or by a laser cutting device 330 or by combinations of the two or even other singulating techniques.

Figure 10:
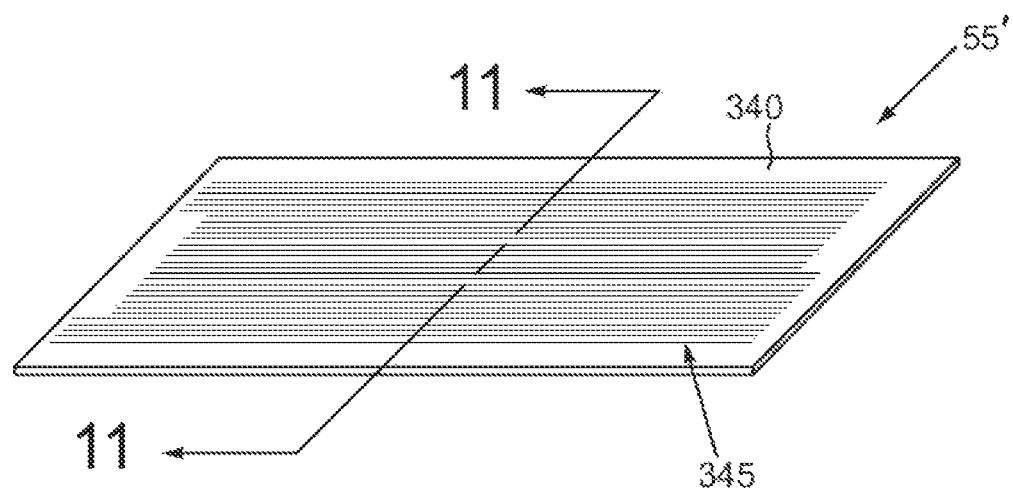
FIG. 10 is a pictorial view of an alternate exemplary chiplet.
Figure 11:
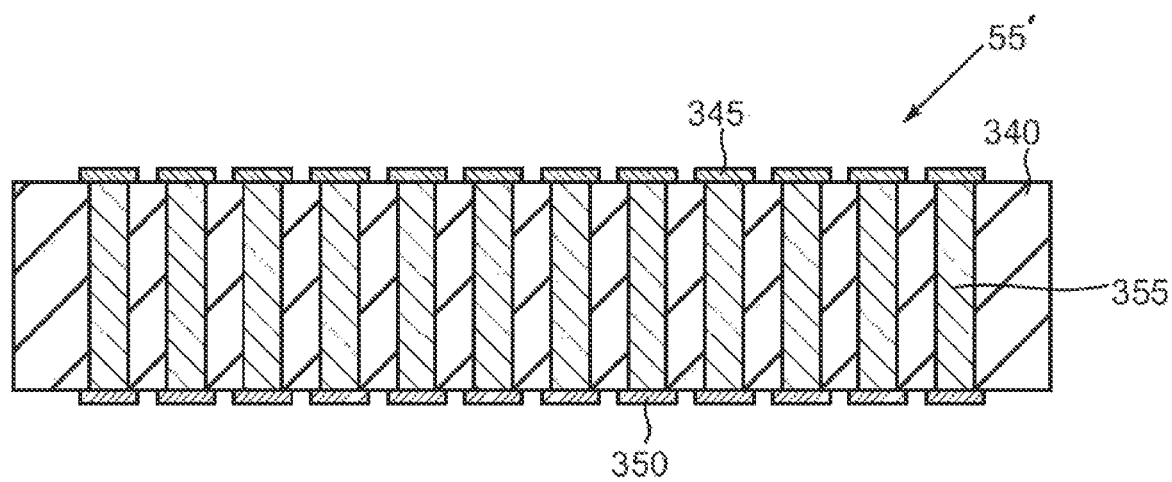
FIG. 11 is a sectional view of FIG. 10 taken at section 11-11.

As noted above, the chiplet 55 may be configured in a variety of ways. While the embodiment of the chiplet 55 depicted in FIGS. 3, 4 and 7 is a build-up design, other configurations are possible. For example, and as shown in FIGS. 10 and 11, an alternate exemplary chiplet 55N may be constructed of a substrate 340, which may be a ceramic material, a semiconductor such as silicon or germanium or even silicon-on-insulator or semiconductor on insulator and include top side interconnects 345 and bottom side interconnects 350 which may include traces, pads or other types of conductors and better interconnected by through vias 355, which may be plated through holes, through silicon vias, or other types of top-to-bottom interconnect structures. It may of course be possible to mix and match different types of chiplets, that is, an organic chiplet 55N and then construct the chiplet 50 from one of the configurations depicted in FIG. 10 or something similar. Note also that the embodiment depicted in FIGS. 10 and 11 still provides not only chip-to-chip interconnect capability but also chip-to-circuit board interconnections as with the embodiments disclosed elsewhere herein.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing a circuit board, comprising:
providing a substrate having a conductor layer, wherein the substrate comprises plural build-up layers;
fabricating a pocket in the substrate, the pocket extending vertically into at least two of the build-up layers and exposing a portion of the conductor layer during the fabricating of the pocket into the at least two build-up layers of the substrate;
positioning a chiplet in the pocket, the chiplet having plural bottom side interconnects and plural top side interconnects, the top side interconnects adapted to interconnect with two or more semiconductor chips; and
electrically connecting the bottom side interconnects to the conductor layer.

2. The method of claim 1, wherein the circuit board comprises a package substrate.

3. The method of claim 1, wherein the chiplet comprises an organic circuit board.

4. The method of claim 1, wherein the chiplet comprises a ceramic circuit board.

5. The method of claim 1, wherein the chiplet comprises a semiconductor chip.

6. The method of claim 1, wherein the circuit board comprises circuit structures arranged according to a first design rule of a first density, the chiplet comprising circuit structures arranged according to a second design rule of second density smaller than the first density.

7. The method of claim 1, comprising mounting a first semiconductor chip on the circuit board and a second semiconductor chip on the circuit board, and electrically connecting the first semiconductor chip to the second semiconductor chip with the chiplet.

8. The method of claim 1, wherein the plural build-up layers comprise vias and conductor traces.

9. A method of manufacturing, comprising:
fabricating a chiplet to insert into a pocket of a circuit board, the chiplet having plural bottom side interconnects to electrically connect to a conductor layer of the circuit board and plural top side interconnects adapted to interconnect with two or more semiconductor chips, wherein the circuit board comprises plural build-up layers, the pocket extending vertically into at least two of the build-up layers and including a portion of the conductor layer exposed during fabricating of the pocket into the at least two build-up layers.

10. The method of claim 9, wherein the circuit board comprises a package substrate.

11. The method of claim 9, wherein the chiplet comprises an organic circuit board, a ceramic circuit board or a semiconductor chip.

12. The method of claim 9, wherein the plural build-up layers comprise vias and conductor traces.

13. A method of manufacturing a semiconductor chip device, comprising:
providing a substrate of a circuit board having a conductor layer, wherein the substrate comprises plural build-up layers;
fabricating a pocket in the substrate, the pocket extending vertically into at least two of the build-up layers and exposing a portion of the conductor layer during the fabricating of the pocket into the at least two build-up layers of the substrate;
positioning a chiplet in the pocket, the chiplet having plural bottom side interconnects and plural top side interconnects, the top side interconnects adapted to interconnect with two or more semiconductor chips;
electrically connecting the bottom side interconnects to the conductor layer; and
mounting a first semiconductor chip on the circuit board and a second semiconductor chip on the circuit board, and electrically connecting the first semiconductor chip to the second semiconductor chip with the chiplet.

14. The method of claim 13, wherein the circuit board comprises a package substrate.

15. The method of claim 13, wherein the chiplet comprises an organic circuit board.

16. The method of claim 13, wherein the chiplet comprises a ceramic circuit board.

17. The method of claim 13, wherein the chiplet comprises a semiconductor chip.

18. The method of claim 13, wherein the circuit board comprises circuit structures arranged according to a first design rule of a first density, the chiplet comprising circuit structures arranged according to a second design rule of second density smaller than the first density.

19. The method of claim 13, wherein the plural build-up layers comprise vias and conductor traces.

* * * * *